United States Patent [19]
Akizuki et al.

[11] Patent Number: 6,064,183
[45] Date of Patent: May 16, 2000

[54] DEVICE DETECTING THE AMOUNT OF CHARGE REMAINING IN A BATTERY

[75] Inventors: Hiroshi Akizuki, Takatsuki; Nobuhide Dotsubo, Daito, both of Japan

[73] Assignee: Sanyo Electric Co., Ltd., Osaka, Japan

[21] Appl. No.: 09/230,619

[22] PCT Filed: Jul. 30, 1997

[86] PCT No.: PCT/JP97/02662

§ 371 Date: Jan. 28, 1999

§ 102(e) Date: Jan. 28, 1999

[87] PCT Pub. No.: WO98/06159

PCT Pub. Date: Feb. 12, 1998

[30] Foreign Application Priority Data

Aug. 5, 1996 [JP] Japan ................................. 8-206261

[51] Int. Cl.$^7$ ................................. H02J 7/04; H02J 7/16
[52] U.S. Cl. ................................. 320/132; 320/149
[58] Field of Search ................................. 320/127, 132, 320/134, 135, 136, 149; 340/635, 636; 429/61, 90; 324/427, 429, 433

[56] References Cited

FOREIGN PATENT DOCUMENTS

| | | |
|---|---|---|
| 3-003484 | 1/1991 | Japan . |
| 3-079172 | 4/1991 | Japan . |
| 3-238975 | 10/1991 | Japan . |
| 4-50935 | 2/1992 | Japan . |
| 5-312852 | 11/1993 | Japan . |
| 6-022262 | 1/1994 | Japan . |
| 7-092245 | 4/1995 | Japan . |

*Primary Examiner*—Edward H. Tso
*Attorney, Agent, or Firm*—Michael & Wallace; Peter L. Michaelson

[57] ABSTRACT

When an electronic still camera in which a value of a voltage from a battery 2 is compared with reference values in a heavily loaded condition, i.e. with an LCD monitor 21 operated, to detect the current amount of charge remaining in the battery and a battery voltage obtained that is lower than a reference value R3 forces the body of the camera to be powered off, is again powered on without changing the battery, the battery is immediately placed in a lightly loaded condition, since LCD monitor 21 is in a non-operating state. Thus, battery voltage increases and thus exceeds the reference value and this disadvantageously results in a result different from that of detection of the amount of charge remaining in the battery that is obtained before the camera is powered off. In order to overcome the disadvantage, the present invention allows the reference value R3 to be increased by a predetermined value a corresponding to the increase in battery voltage that results from the load reduction to set a new reference value when the camera is first forced to be powered off and is then powered on without changing the battery.

4 Claims, 2 Drawing Sheets

DEVICE DETECTING THE AMOUNT OF CHARGE REMAINING IN A BATTERY

TECHNICAL FIELD

The present invention relates to a device detecting the amount of charge remaining in a battery used for electronics, such as electronic still camera, video camera, which employ a battery, such as a dry cell, a secondary cell, as a power supply.

BACKGROUND ART

Typically, the amount of charge remaining in a battery used in electronics, such as a electronic still camera, a video camera, which uses a battery, such as various types of cells, as a power supply is normally grasped depending on the output voltage of the battery and is signaled to the user. When the battery is running down, battery replacement is typically urged. When the battery is extremely running down and battery voltage drops below a predetermined lower limit, the body of the camera is typically forced to be powered off to prohibit shooting.

According to an appreciated and thus applied system, recent electronic still cameras and video cameras are provided with an optical view finder plus a large-screen liquid crystal display monitor (LCD monitor) which is placed in an operating state as required by the user to display an image sensed picture or a reproduced image thereon.

However, the LCD monitor mounted to the camera and placed in an operating state as required, as described above is also supplied with power from the battery of the camera. Thus the load on the battery varies depending on whether the LCD monitor is in an operating state or a non-operating state. This load variation results in varied battery voltage and hence the following disadvantage.

More specifically, it is assumed that when the amount of charge remaining in the battery of the camera is detected with the LCD monitor operated and a decision is made that the battery voltage drops below the lower limit so that the camera is once powered off forcibly, i.e. when any more shooting is impossible without changing the battery and the user is thus urged to change the battery, the user again operates the power-supply button without changing the battery to place the power supply in an on state. In such case, since the LCD monitor is maintained in a non-operating state until the user operates an LCD display button for starting monitor display, the load on the battery is reduced by the power to be supplied to the LCD monitor as compared with the load on battery that was provided when the power supply was forcibly placed in the off state so that battery voltage increases and thus slightly exceeds the lower limit. Thus the power supply is not forcibly placed in an off state and this state is different from the previous state urging the user to change the battery. This confuses the user as to which decision is correct.

The present invention therefore contemplates a device detecting the amount of charge remaining in a battery, wherein a decision based on the detected amount of charge remaining therein with the LCD monitor operated that the battery should be changed is not reversed even when the LCD monitor is placed in an non-operating state and the load on the battery is thus reduced.

DISCLOSURE OF INVENTION

According to the invention recited in claim 1 of the present application, a device detecting the amount of charge remaining in a battery including a battery supplying a current to a body of electronics, comparison means for comparing a value of a voltage output from the battery with a reference value, and power supply control means for automatically powering off the body of the electronics when the value of the voltage output from the battery is lower than the reference value, is characterized in that the reference value is increased from an initial value by a predetermined amount when the body of the electronics is automatically powered off by the power supply control means depending on the comparison result from the comparison means and is then again powered on via manual operation of the power supply switch.

According to claim 2 of the present application, the device detecting the amount of charge remaining in a battery according to claim 1 is characterized in that the body of the electronics is provided with monitor means receiving a current supply from the battery and thus operable as required and that the monitor means is maintained in a non-operating state until an indication of monitor operation is provided with the body of the electronics returned to the powered-on state.

According to claim 3 of the present application, the device detecting the amount of charge remaining in a battery according to claim 2 is characterized in that the body of the electronics is an electronic still camera and that an image sensed picture is displayed on the monitor means.

According to claim 4 of the present application, the device detecting the amount of charge remaining in a battery according to claim 1 is characterized in that the reference value is returned to the initial value when the reference value is first increased from the initial value by the predetermined amount and the battery is then changed.

BEST MODE FOR CARRYING OUT THE INVENTION

Figure 1:
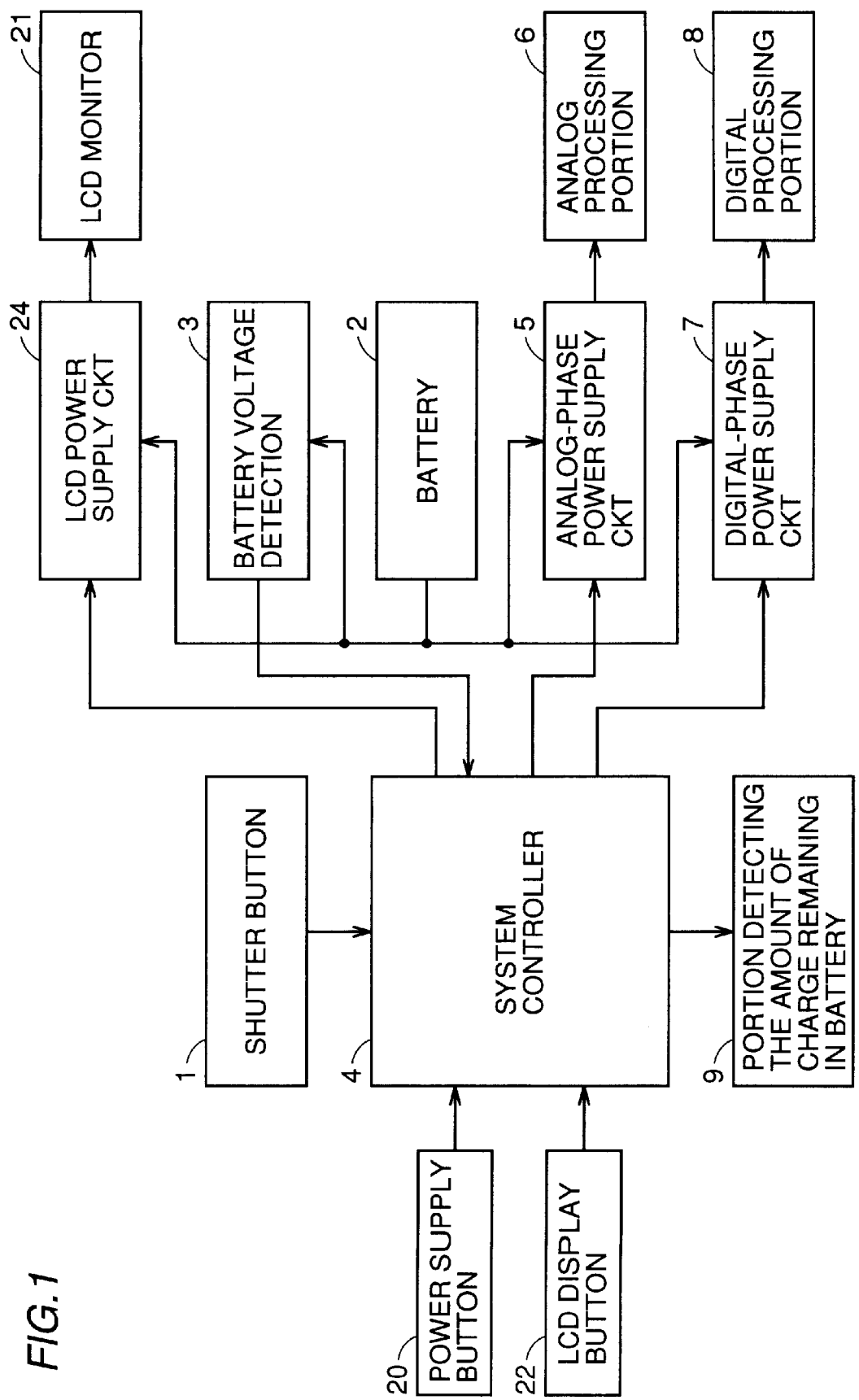
FIG. 1 is a schematic block diagram showing a configuration of an electronic still camera according to an embodiment of the present invention.

One embodiment of the present invention will now be described with reference to the figures. FIG. 1 is a block diagram showing a main portion of an electronic still camera as a device according to the present embodiment.

Referring to the figure, the main portion of the electronic still camera includes: a shutter button 1 used by the user to direct the camera to shoot; a battery 2 removably mounted to the camera; a battery voltage detector circuit 3 detecting a voltage value at an output stage of battery 2 and A–D converting and outputting the voltage value as a battery voltage value; and a system controller 4 receiving an output from battery voltage detector circuit 3 to control the driving of the power supply circuits 5, 7 and 24 described hereinafter and issue a display command to a portion displaying the amount of charge remaining in the battery 9.

The main portion of the electronic still camera also includes a power supply button 20 manually operable by the user to power on various portions of the camera other than the LCD monitor 21 described hereinafter and an output from power supply button 20 is input to system controller 4. The main portion of the electronic still camera also includes LCD monitor 21 mounted to the camera for displaying an image sensed video data, and an LCD display button 22 manually operated by the user to power on LCD monitor 21. An output from display button 22 is also received by system controller 4. As is similar to shutter button 1, power supply button 20 and LCD display button 22 are both arranged at the cabinet of the camera.

An analog-phase power supply circuit 5 receives an output from battery 2 to supply a voltage required for driving an analog processing portion 6 which processes a video signal at the analog phase, such as a CCD imager driver circuit. More specifically, analog-phase power supply circuit 5 is formed by a DC-DC converter having its operation controlled by system controller 4 to change a battery voltage of 6 V into a plurality of levels of DC voltage required for various portions of analog processing portion 6.

A digital-phase power supply circuit 7 receives an output from the battery to supply a voltage required to drive a digital processing portion 8 which processes a signal obtained by digitally converting a video signal taken from analog processing portion 6, such as a color separation circuit, gamma correction circuit, a signal compression circuit. As is similar to analog-phase power supply circuit 5, digital-phase power supply circuit 7 is formed by a DC-DC converter having its operation also controlled by system controller 4 to change a voltage into a plurality of levels of DC voltage that are required for various portions of digital processing portion 8.

System controller 4 compares the battery voltage value detected by battery voltage detector circuit 3 with a plurality of threshold values and issues to the portion displaying the amount of charge remaining in the battery 9 a plurality of types of display commands depending on the comparison result. The portion displaying the amount of charge remaining in the battery 9 receives the display commands and provides a display corresponding to each display command.

LCD power supply circuit 24 receives an output from the battery 2 to supply a voltage required to drive and thus allows LCD monitor 21 to display an imaged sensed picture. LCD power supply circuit 24 controls current supply from battery 2 to LCD monitor 21 according to an indication from system controller 4 that is based on an operation of LCD display button 22.

Figure 2:
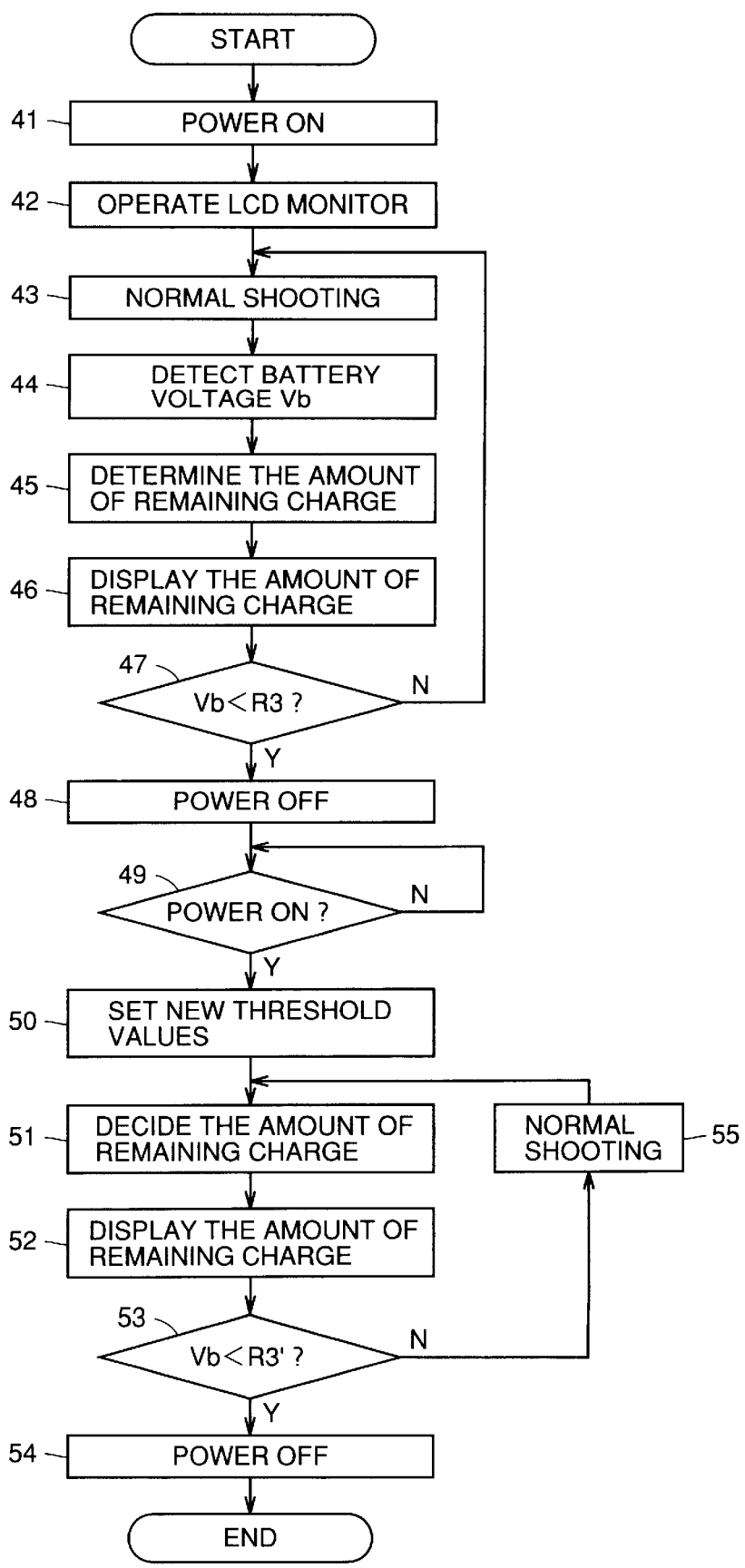
FIG. 2 is a flow chart representing a procedure to detect the amount of charge remaining in a battery.

An operation of each portion shown in the FIG. 1 block diagram, and a procedure of detecting the amount of charge remaining in the battery that is associated with variation of battery voltage will now be described with reference to the flow chart shown in FIG. 2.

Initially, at step 41, when the user operates power supply button 20 to input to system controller 4 an indication to power on the camera, system controller 4 issues a command to cause analog-phase and digital-phase power supply circuits 5 and 7 to simultaneously supply power to analog and digital processing portions 6 and 8, respectively.

Then, at step 42, when the user operates LCD display button 22, system controller 4 issues a command to LCD power supply circuit 24 to supply an output from battery 2 to LCD monitor 21 to place LCD monitor 21 in an operating state.

After steps 41 and 42, the camera is placed in a normal shooting state at step 43. In the normal shooting state, shooting is normally provided, i.e. analog processing portion 6 supplied with power from analog-phase power supply circuit 5 has the CCD imager driven to start exposure and successively produces and outputs image signals while digital processing portion 7 supplied with power from digital-phase power supply circuit 7 color separation, gamma correction and the like to the image signals to process the image signals into video data. The video data obtained through such a signal process are supplied to and displayed on LCD monitor 21. The user see the image on LCD monitor 21, and presses shutter button 1 when the desired display and angle of view of the object to be shot is obtained on LCD monitor 21. The video data obtained immediately after shutter button 1 is pressed is signal-compressed and then stored in a storage medium (not shown), e.g. a semiconductor memory such as flash memory, a memory card.

In the normal shooting state, battery voltage detector circuit 3 normally detects the voltage output from battery 2 as a battery voltage value Vb (step 44) and outputs the detected result to system controller 4. System controller 4 compares the detected result with a plurality of predetermined threshold values R1, R2 and R3 to determine the amount of the charge remaining in the battery (Step 45).

The threshold values are previously set based on values actually measured, as threshold value R1, the battery voltage value that can be attained when the battery is 50% full of charge, threshold value R2, the battery voltage value that can be attained when the battery is 10% full of charge, and threshold value R3, the battery voltage value that can be attained when the battery is 5% full of charge. The relation R1≦Vb indicates the first state, indicating that the amount of the charge remaining in the battery is adequate. The relation R2≦Vb<R1 indicates the second state, indicating that the amount of the charge remaining in the battery is less than half. The relation R3≦Vb<R2 indicates the third state, indicating that the amount of the charge remaining in the battery drops below 10% and is thus significantly reduced. The relation Vb<R3 indicates the fourth state, indicating that the amount of the charge remaining in the battery is almost zero.

When the current state of the amount of charge remaining in the battery is determined from the four states, the portion displaying the amount of charge remaining in the battery 9 is directed to provide a specific display corresponding to the decision and responsively displays one of the four states distinctively (step 46).

When decision is made that the current state of the amount of charge remaining in the battery is the fourth state, which establishes the relation Vb<R3 (step 47), system controller 4 assumes that further shooting cannot be provided, and issues a command to various portions to forcibly power off the camera in addition to the display at the portion displaying the amount of charge remaining in a battery 9. More specifically, analog-phase and digital-phase power supply circuits 5 and 7 and LCD power supply circuit 24 are prevented from supplying power to analog and digital processing portions 6 and 8 and LCD monitor 21, and the portion displaying the amount of charge remaining in the battery 9 is also placed in a non-operating state (step 48).

When the entirety of the camera is thus forcibly powered off, the user is typically required to replace the battery with a fully charged battery. However, let us now assume that the user does not change the battery and again operates power supply button 20 to power on the camera.

When power supply button 20 is again operated to power on the camera and LCD display button 22 is not operated, LCD monitor 21 is maintained in the non-operating state. Thus the current load on the battery is reduced by the electric current supplied to LCD monitor 21 from the previous load on the battery that is provided when an amount of charge remaining in the battery is previously detected. This load reduction causes battery voltage value to be increased.

Comparing the increased battery voltage value with the three threshold values provides a result different from the previous result of decision on the amount of charge remaining in the battery. More specifically, in spite of the previous decision that the amount of the charge remaining in the battery is in the fourth state and further shooting cannot be provided, the state of the amount of the charge remaining in the battery with the LCD monitor in an non-operating state after the camera is powered on can be decided as the second or third state with the same battery used. This results in a less reliable detection of the amount of charge remaining in the battery and the user is unnecessarily confused.

Accordingly, when the camera is again powered on, the process goes to step 50 via step 49. At step 50, a predetermined amount a is added to the three threshold values used in determining the amount of charge remaining in the battery to obtain new threshold values R1'=R1+a, R2'=R2+a, and R3'=R3+a which are substituted for threshold values R1, R2 and R3. The newly set threshold values R1', R2' and R3' are compared with battery voltage value Vb to decide the current amount of charge remaining in the battery (step 51) and the decision is displayed (step 52). In this decision, a result similar to the previous result can be expected since while battery voltage is increased due to reduction in the load on the battery that is caused by driving LCD monitor 21, the threshold values used for comparison with the battery voltage are increased.

At step 53, battery voltage is compared with the threshold values. When battery voltage value Vb is compared with the newly set threshold value R3' to find that the relation Vb<R3' is maintained, the camera is immediately powered off (step 54). If it has been determined at step 51 that R3'≦Vb, normal shooting is provided (step 55).

It should be noted that when the user operates LCD display button 22 in normally shooting at step 55 and LCD monitor 21 thus starts to operate, the load on the battery is accordingly increased and the battery voltage drops and thus comes to more readily attain a value smaller than the newly set and thus increased threshold value R3'.

Predetermined value a as an increase of the threshold values is previously set at a fixed value based on a value actually measured and corresponds to the valiance in the battery voltage value that results from the load variation associated with operation of LCD monitor 21. It is not limited to a fixed value and can be set for each threshold value. More specifically, predetermined value a is set at 10% of each of the initial threshold values. More specifically, predetermined values a of 0.1×R1, 0.1×R2, and 0.1×R3 can be set for threshold values R1, R2 and R3, respectively.

A threshold value increased by a predetermined value a returns to the initial state, i.e. the value before the predetermined value a is added thereto, when battery 2 is replaced by a fully charged battery and battery voltage is increased sufficiently. It should be noted that the fully charged battery can be detected by detecting occurrence of the state that the relation R1'<Vb is satisfied after battery replacement. Battery replacement can be also be provided by means of a mechanical detection mechanism.

While in the above embodiment, LCD display button 22 continuously pressed allows LCD monitor 21 to be maintained in an operating state, each press on LCD button 22 may provide one pulse input to system controller 4 which switches LCD monitor 21 alternately between operating state and non-operating state for each pulse input. In this example, when the body of the camera is once forced to be powered off with LCD display button 22 pressed to place LCD monitor 21 in an operating state and power supply button 20 is then operated to again power on the body of the camera, system controller 4 is once reset and LCD monitor 21 is placed in an non-operating state until LCD display button 22 is pressed.

INDUSTRIAL APPLICABILITY

According to the present invention, the user is not unnecessarily confused by erroneous detection of the amount of charge remaining in the battery when battery voltage is increased depending on the reduction in the load on the battery in powering on the body of electronics without changing the battery and also operating the body with a light load on the battery after an amount of charge remaining in the battery is detected with a heavy load on the battery to find that the battery runs down so that battery voltage drops below the lower limit and the body of the electronics is thus automatically powered off.

What is claimed is:

1. A device which detects an amount of charge remaining in a battery, comprising:

a battery supplying a current to a body of electronics;

comparison means for comparing a value of a voltage output from said battery with a reference value; and power supply control means for automatically powering off said body of said electronics when said value of said voltage output from said battery is lower than said reference value; wherein when said power supply control means first automatically powers off said body of said electronics depending on a comparison result from said comparison means and said body of said electronics is then again powered on by manually operating a power supply switch, said reference value is increased from an initial value by a predetermined amount.

2. The device which detects an amount of charge remaining in a battery according to claim 1, wherein said body of said electronics is provided with monitor means receiving a current supply from said battery, said monitor means being maintained in a non-operating state until monitor operation is indicated after said body of said electronics returns to powered-on state.

3. The device which detects an amount of charge remaining in a battery according to claim 2, wherein said body of said electronics is an electronic still camera and an image sensed picture is displayed on said monitor means.

4. The device which detects an amount of charge remaining in a battery according to claim 1, wherein said reference value returns to said initial value when said reference value is first increased from said initial value by said predetermined amount and said battery is then replaced.

* * * * *

UNITED STATES PATENT AND TRADEMARK OFFICE
CERTIFICATE OF CORRECTION

PATENT NO. : 6,064,183
DATED : May 16, 2000
INVENTOR(S) : Hiroshi Akizuki, et. al.

It is certified that error appears in the above-indentified patent and that said Letters Patent is hereby corrected as shown below:

Title page, under "Attorney, Agent, or Firm", change "Michael" to -- Michaelson--.

Signed and Sealed this

Twentieth Day of March, 2001

Attest:

NICHOLAS P. GODICI

Attesting Officer     Acting Director of the United States Patent and Trademark Office